United States Patent [19]
Gopinathan

[11] Patent Number: 5,489,872
[45] Date of Patent: Feb. 6, 1996

[54] TRANSCONDUCTANCE-CAPACITOR FILTER CIRCUIT WITH CURRENT SENSOR CIRCUIT

[75] Inventor: Venugopal Gopinathan, Dallas, Tex.

[73] Assignee: Texas Instruments Incorporated, Dallas, Tex.

[21] Appl. No.: 186,205

[22] Filed: Jan. 25, 1994

[51] Int. Cl.[6] .............................. H03B 1/00; G01R 19/00; H03K 5/22
[52] U.S. Cl. .................. 327/552; 327/52; 327/65; 327/336
[58] Field of Search ..................... 327/103, 336, 327/339, 341–345, 551, 552, 556, 557, 558, 51–56, 63, 65–67; 330/306

[56] References Cited

U.S. PATENT DOCUMENTS

| | | | |
|---|---|---|---|
| 4,675,594 | 6/1987 | Reinke | 327/103 |
| 4,806,880 | 2/1989 | Laws | 327/336 |
| 4,914,401 | 4/1990 | Mäder | 330/306 |
| 4,961,046 | 10/1990 | De Jager | 327/103 |
| 5,166,560 | 11/1992 | Liu | 327/103 |
| 5,227,681 | 7/1993 | Koyama et al. | 327/65 |

*Primary Examiner*—Toan Tran
*Attorney, Agent, or Firm*—W. Daniel Swayze, Jr.; W. James Brady, III; Richard L. Donaldson

[57] ABSTRACT

A transconductance-capacitor filter system (8) is provided which includes a transconductance-capacitor filter 10 having a first node (NODE 1) and a second node (NODE 2). A current sensor circuit 12 is coupled to the first node (NODE 1) and the second node (NODE 2).

9 Claims, 1 Drawing Sheet ced according to the teachings of the present invention;

TRANSCONDUCTANCE-CAPACITOR FILTER CIRCUIT WITH CURRENT SENSOR CIRCUIT

TECHNICAL FIELD OF THE INVENTION

This invention relates in general to the field of electronic systems and more particularly to a current sensor circuit and method of operation.

BACKGROUND OF THE INVENTION

Active filters are widely used in electronic circuits. The basic building block of an active filter is an integrator. An integrator is a block of circuit elements that operates to integrate an input voltage and to provide an output voltage signal which is the integral of the input voltage signal. One circuit element which can be used as an integrator in an integrated circuit chip is a capacitor. The voltage across a capacitor is proportional to the integral of the current flowing through the capacitor. Thus, a technique used to perform integration comprises converting the voltage signal to be integrated into a current signal and pumping the current signal into a capacitor to produce an output voltage signal which is the integral of the input voltage signal. A voltage signal can be converted into a current signal by using a voltage-to-current converter circuit also referred to as a transconductance amplifier. An integrator is an electronic circuit which combines a capacitor and a transconductance amplifier to integrate an input voltage signal. A transconductance-capacitor filter utilizes integrators to implement a filter.

SUMMARY OF THE INVENTION

A need has arisen for a current sensor circuit operable to sense the current flowing through the capacitor in a transconductance-capacitor filter.

In accordance with the present invention, a current sensor circuit and method of operation is provided which is operable to sense the capacitor current in a transconductance-capacitor filter.

According to one embodiment of the present invention, a current sensor circuit is provided which comprises a differential pair which has a first input, a second input, a first current path and a second current path. The differential pair is operable to provide a level of AC current at the first current path and to pull the level of AC current from the second current path responsive to a voltage across the first input and the second input. A load is coupled to the first current path and to the second current path. The load is operable to conduct the level of AC current from the first current path to the second current path and operable to sense a magnitude of the level of AC current.

BRIEF DESCRIPTION OF THE DRAWINGS

A more complete understanding of the present invention may be acquired by referring to the following description taken in conjunction with the accompanying drawings in which like reference numbers indicate like features and wherein.

DETAILED DESCRIPTION OF THE INVENTION

Figure 1:
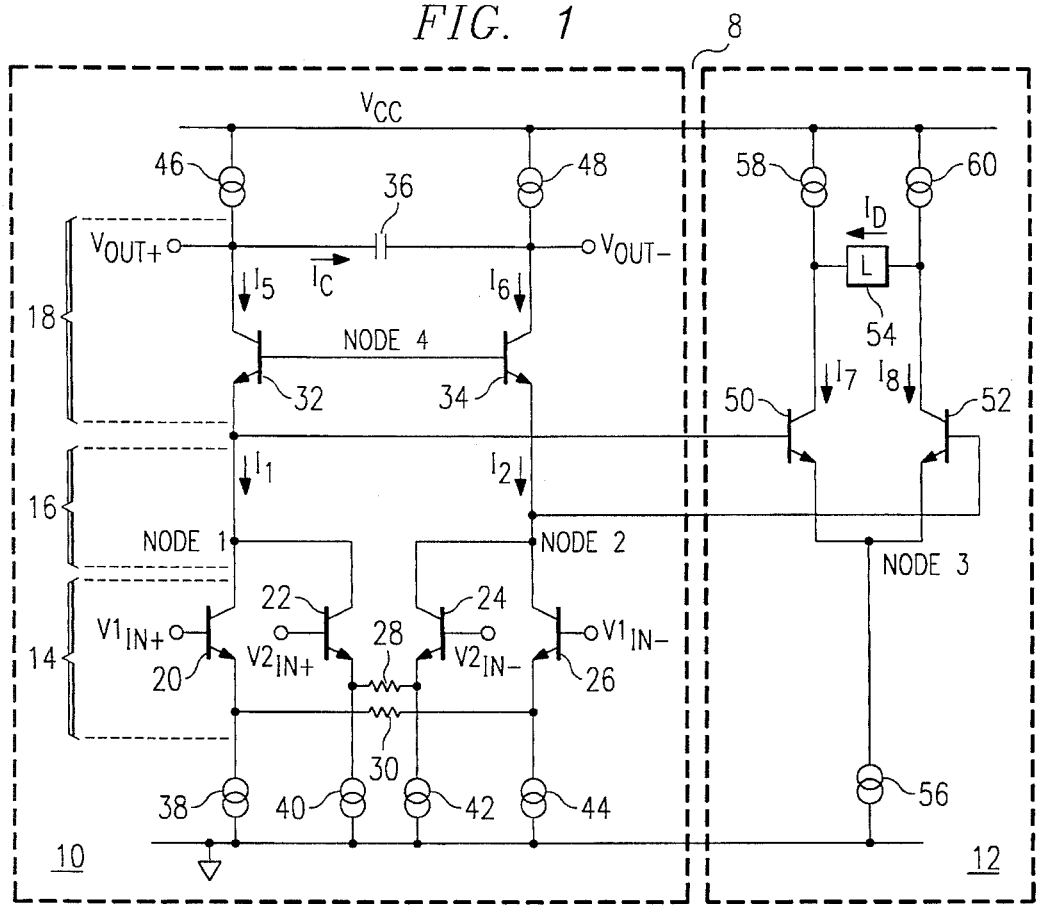
FIG. 1 illustrates a circuit diagram of a transconductance-capacitor filter system including a current sensor circuit constructed according to the teachings of the present invention.

FIG. 1 illustrates a transconductance-capacitor filter system 8 which includes a transconductance-capacitor filter 10 and a current sensor circuit 12 constructed according to the teachings of the present invention. The transconductance-capacitor filter 10 comprises a voltage-to-current conversion stage 14, a current summing stage 16 and an integrator stage 18.

The voltage-to-current conversion stage 14 comprises an NPN transistor 20, an NPN transistor 22, an NPN transistor 24, and an NPN transistor 26. The voltage-to-current conversion stage 14 further comprises a resistor 28 and a resistor 30. NPN transistor 20, NPN transistor 22, NPN transistor 24, and NPN transistor 26 each comprises a base, a collector and an emitter. The collector of NPN transistor 20 and the collector of NPN transistor 22 are coupled to a first node, NODE 1. The collector of NPN transistor 24 and the collector of NPN transistor 26 are coupled to a second node, NODE 2. The resistor 28 is coupled to the emitter of NPN transistor 22 and to the emitter of NPN transistor 24. The resistor 30 is coupled to the emitter of NPN transistor 20 and the emitter of NPN transistor 26.

NPN transistor 20, resistor 30, and NPN transistor 26 comprise a transconductance amplifier for which the base of NPN transistor 20 and the base of NPN transistor 26 comprise a pair of inputs. A first input voltage $V1_{IN}$ is connected across the base of NPN transistor 20 and the base of NPN transistor 26 with $V1_{IN+}$ at the base of NPN transistor 20 and $V1_{IN-}$ at the base of NPN transistor 26.

NPN transistor 22, NPN transistor 24, and the resistor 28 comprise a transconductance amplifier for which the base of NPN transistor 22 and the base of NPN transistor 24 comprise a pair of inputs. A second input voltage $V2_{IN}$ is connected across the base of NPN transistor 22 and the base of NPN transistor 24 with $V2_{IN+}$ at the base of NPN transistor 22 and $V2_{IN-}$ at the base of NPN transistor 24.

The current summing stage 16 comprises NODE 1 and NODE 2. The collector of NPN transistor 20 and the collector of NPN transistor 22 are coupled to NODE 1. The collector of NPN transistor 24 and the collector of NPN transistor 26 are coupled to NODE 2. A current $I_1$ flows from transistor 32 to transistor 20 through NODE 1, and a current $I_2$ flows from transistor 34 to transistor 26 through NODE 2. The voltage-to-current conversion stage 14 could comprise any number of transconductance amplifiers connected to NODE 1 and NODE 2. The current summing stage is operable to sum currents produced by each transconductance amplifier included in the voltage-to-current conversion stage 14.

The integrator stage 18 comprises an NPN transistor 32 and an NPN transistor 34. The integrator stage further comprises an integrating capacitor 36. NPN transistor 32 and NPN transistor 34 each comprise a base, a collector and an emitter. The base of NPN transistor 32 is coupled to NODE 4, and the emitter of NPN transistor 32 is coupled to NODE 1. The base of NPN transistor 34 is coupled to NODE 4, and the emitter of NPN transistor 34 is coupled to NODE 2. NODE 4 provides a bias voltage for the base of NPN transistor 32 and NPN transistor 34. The integrating capacitor 36 is coupled to the collector of NPN transistor 30 and to the collector of NPN transistor 34. A current $I_5$ flows through the collector of NPN transistor 32, and a current $I_6$ flows through the collector of NPN transistor 34. A current $I_C$ flows through the integrating capacitor 36.

The transconductance-capacitor filter 10 further comprises a DC current source 38, a DC current source 40, a DC current source 42, a DC current source 44, a DC current source 46, and a DC current source 48. DC current source 38 is coupled to the emitter of NPN transistor 20 and to ground potential. DC current source 40 is coupled to the emitter of NPN transistor 22 and to ground potential. DC current source 42 is coupled to the emitter of NPN transistor 24 and to ground potential. DC current source 44 is coupled to the emitter of NPN transistor 26 and to ground potential. DC current source 46 is coupled to the collector of NPN transistor 32 and to a power supply $V_{cc}$. DC current source 48 is coupled to the collector of NPN transistor 34 and to the power supply $V_{cc}$.

The current sensor circuit 12 comprises an NPN transistor 50 and an NPN transistor 52. NPN transistor 50 and NPN transistor 52 each comprise a base, a collector and an emitter. The base of NPN transistor 50 is coupled to NODE 1, and the emitter of NPN transistor 50 is coupled to NODE 3. The base of NPN transistor 52 is coupled to NODE 2, and the emitter of NPN transistor 52 is coupled to NODE 3. NPN transistor 50 and NPN transistor 52 comprise a differential pair for which the base of NPN transistor 50 and the base of NPN transistor 52 comprise a pair of inputs. A load 54 is coupled to the collector of NPN transistor 50 and to the collector of NPN transistor 52. A current $I_7$ flows through the collector of NPN transistor 50, and a current $I_8$ flows through the collector of NPN transistor 52. A current $I_D$ flows through the load 54.

The current sensor circuit 12 also comprises a DC current source 56, a DC current source 58, and a DC current source 60. DC current source 56 is coupled to NODE 3 and to ground potential. Current source 58 is coupled to the power supply $V_{cc}$ and to the collector of NPN transistor 50. DC current source 60 is coupled to the power supply $V_{cc}$ and to the collector of NPN transistor 52.

The transconductance-capacitor filter 10 operates to produce an output voltage $V_{OUT}$ which is the integral of the sum of the first input voltage $V1_{IN}$ and the second input voltage $V2_{IN}$. The current sensor circuit 12 operates to sense the magnitude of the level of current flowing through the integrating capacitor 36.

The nine DC current sources in the transconductance-capacitor filter 10 and the current sensor circuit 12 operate to maintain the biasing of the eight NPN transistors. DC current source 38, DC current source 40, DC current source 42, and DC current source 44 operate to provide a DC threshold current $I_T$ to bias NPN transistor 20, NPN transistor 22, NPN transistor 24, and NPN transistor 26. DC current source 46 and DC current source 48 operate to provide a DC current equal to twice the magnitude of the sum of the threshold current $I_T$ to bias NPN transistor 32 and NPN transistor 34. DC current source 56 operates to provide a current proportional to the magnitude of the sum of the currents provided by DC current sources 46 and 48. DC current source 58 and DC current source 60 operate to provide a current equal to one-half the magnitude of the current provided by DC current source 56. DC current source 56, DC current source 58, and DC current source 60 operate to bias NPN transistor 50 and NPN transistor 52. Thus, the nine DC current sources operate to provide DC biasing for all of the NPN transistors in the transconductance-capacitor filter 10 and the current sensor circuit 12. The ratio of the current provided by DC current source 58 or 60, which are equal, to the current provided by DC current source 46 or 48, which are equal, corresponds to the ratio of $I_D$ to $I_C$.

The transconductance-capacitor filter 10 operates on the AC input voltage signals $V1_{IN}$ and $V2_{IN}$ to provide an AC output voltage signal $V_{OUT}$. The current sensor circuit 12 operates on the AC voltage signal across NODE 1 and NODE 2 to produce an AC output current signal $I_D$ flowing through the load 54.

The voltage-to-current conversion stage 14 operates to convert the AC input voltage $V1_{IN}$ to an AC current. Similarly, the voltage-to-current stage 14 operates to convert the AC input voltage $V2_{IN}$ to an AC current. The current summing stage 16 operates to sum the AC currents produced by the voltage-to-current conversion stage 14. The current $I_1$ flowing through NODE 1 is equal to $2I_T$ less the AC current produced by the voltage-to-current conversion stage 14. The current $I_2$ flowing through NODE 2 is equal to $2I_T$ plus the current produced by the voltage-to-current conversion stage 14. Thus, the AC current produced by the current conversion stage 14 flows up through NODE 1, through NPN transistor 32, through the integrating capacitor 36, through NPN transistor 34, through NODE 2 and through the voltage current conversion stage 14 back to NODE 1. The total AC current produced by the voltage-to-current conversion stage 14 is driven through the integrating capacitor 36 which produces the integral of $(V1_{IN}+V2_{IN})$ as the output voltage $V_{OUT}$.

The current sensor circuit 12 operates to sense the magnitude of the current $I_C$ flowing through the integrating capacitor 36. To sense the magnitude of the capacitor current $I_C$, the current sensor circuit 12 measures the difference between $I_1$ and $I_2$ which is equal to the difference between $I_5$ and $I_6$ assuming the NPN transistors 32, 34, 50 and 52 have a relatively high beta. The current sensor circuit 12 senses the magnitude of the current flowing through the integrating capacitor 36 by sensing the AC voltage across the cascode nodes NODE 1 and NODE 2. NPN transistor 50 and NPN transistor 52 are biased by DC current which is proportional to the DC current biasing NPN transistor 32 and NPN transistor 34. The biasing current of NPN transistors 32 and 34 is approximately twice the magnitude of $I_T$, assuming a high beta.

It can be shown that the current $I_D$ flowing through the load 54 is proportional to the current $I_C$ flowing through the integrating capacitor 36. Thus, the current sensor circuit 12 senses the magnitude of the capacitor current, $I_C$. Further, the ratio of $I_C$ to $I_D$ is set by the DC biasing currents, thus the ratio can be set to a desired value. The emitter currents of NPN transistor 32, NPN transistor 34, NPN transistor 50 and NPN transistor 52 are $I_5$, $I_6$, $I_7$ and $I_8$, respectively. Applying the translinear principle to the loop: NODE 4 to NODE 1 to NODE 3 to NODE 2 to NODE 4, it can be proven that $I_c$ will be proportional to $I_D$. In the following equations, "A" is the ratio of the DC current provided by DC current sources 46 or 48, which are equal, to the current provided by DC current source 58 or 60, which are equal.

From the translinear principle, $$I_5 \cdot I_7 = I_8 \cdot I_6$$

also, $$I_5 = 2I_T - I_C$$

and $I_6=2I_T+I_C$, $I_7=2AI_T+I_D$ and $I_8=2AI_T-I_D$ so, $(4AI_T^2+2I_TI_D-2AI_TI_C-I_CI_D)=(4AI_T^2-2\ I_TI_D+2AI_TI_C-I_CI_D)$ $4I_TI_D=4AI_TI_C$ therefore, $I_C=AI_D$ Thus, the current sensor circuit 12 operates to sense the magnitude of the level of the current flowing through the integrating capacitor 36 without interrupting the function of the transconductance-capacitor filter 10. The current $I_D$ is proportional to $I_C$ depending upon the current provided by the DC current sources 56, 58 and 60. The ratio A can be adjusted by adjusting the current provided by DC current sources 56, 58 and 60.

A technical advantage of a current sensor circuit constructed according to the teachings of the present invention is its ability to sense the magnitude of a level of current flowing through an integrating capacitor in a transconductance-capacitor filter and to provide a current proportional to the sensed current. A technical advantage of sensing the capacitor current is that the sensed current can be used to implement a variety of transfer functions. For example, the sensed capacitor current can be used to implement a boosted low pass transconductance-capacitance filter.

Figure 2:
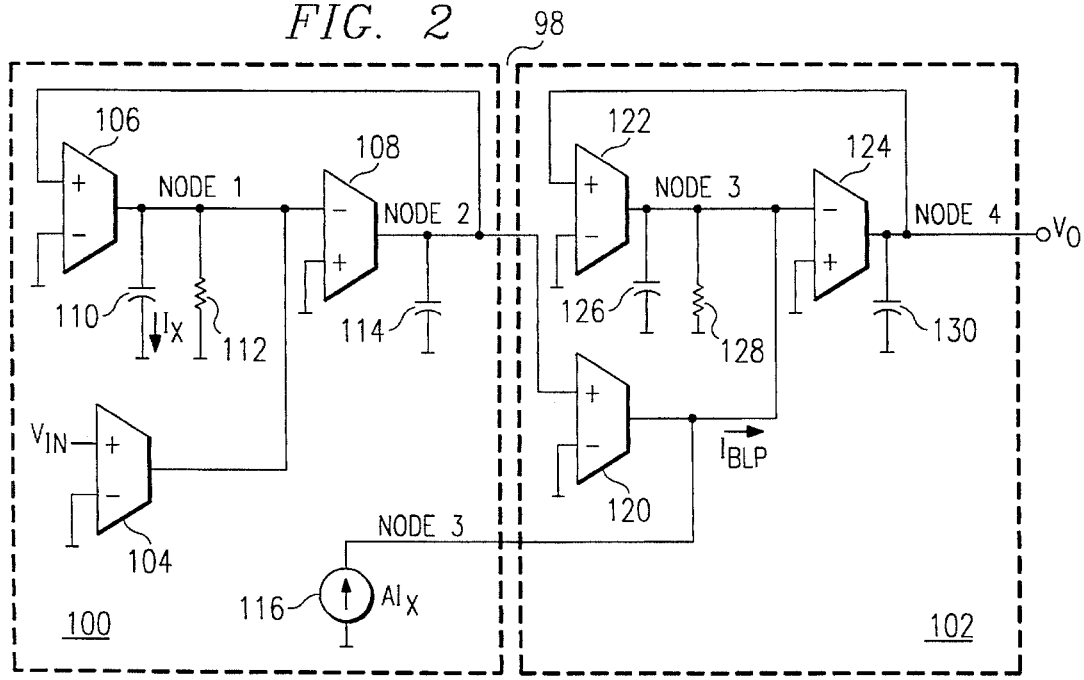
FIG. 2 illustrates a boosted low pass filter utilizing a current sensor circuit constructed according to the teachings of the present invention.

FIG. 2 illustrates a boosted low pass transconductance-capacitor filter 98 utilizing a current sensor circuit constructed according to the teachings of the present invention. The boosted low pass transconductance-capacitor filter 98 illustrated in FIG. 2 comprises a first stage 100 and second stage 102.

The first stage 100 comprises a transconductance amplifier 104, a transconductance amplifier 106, and transconductance amplifier 108. Transconductance amplifier 104, transconductance amplifier 106, and transconductance amplifier 108 each comprise a plus-input, a minus-input and an output. Transconductance amplifier 104 has the plus-input connected to an input voltage signal $V_{IN}$ and the minus-input connected to ground potential. The output of transconductance amplifier 104 is coupled to NODE 1. Transconductance amplifier 106 has the plus-input connected to NODE 2 and the minus-input connected to ground potential° The output of transconductance amplifier 106 is connected to NODE 1. Transconductance amplifier 108 has the plus-input connected to ground potential and the minus-input connected to NODE 1. Transconductance amplifier 108 has its output connected to NODE 1. A capacitor 110 is connected to NODE and to ground potential. A resistor 112 is coupled to NODE 1 and to ground potential° A capacitor 114 is coupled to NODE 2 and to ground potential. An AC current source 116 is connected to ground potential and to NODE 3. The AC current source 116 utilizes a current sensor circuit constructed according to the teachings of the present invention to sense the current $I_x$ flowing through capacitor 110 and to supply a current to NODE 3 proportional in magnitude to $I_x$.

The second stage 102 comprises a transconductance amplifier 120, a transconductance amplifier 122, and a transconductance amplifier 124. Transconductance amplifier 120, transconductance amplifier 122, and transconductance amplifier 124 each comprise a plus-input, a minus-input and an output. The plus-input of transconductance amplifier 120 is connected to NODE 1, and the minus-input of transconductance amplifier 120 is connected to ground potential. The output of transconductance amplifier 120 is connected to NODE 3. The plus-input of transconductance amplifier 122 is connected to NODE 4, and the minus-input of transconductance amplifier 122 is connected to ground potential. The output of transconductance amplifier 122 is connected to NODE 3. The plus-input of transconductance amplifier 124 is connected to ground potential, and the minus-input of transconductance amplifier 124 is connected to NODE 3. The output of transconductance amplifier 124 is connected to NODE 4. A capacitor 126 is connected to NODE 3 and to ground potential. A resistor 128 is connected to NODE 3 and to ground potential. A capacitor 130 is connected to NODE 4 and to ground potential. The current $I_{BLP}$ is the sum of the current provided by the AC current source 116 and current provided by the output of transconductance amplifier 120. NODE 4 provides an output voltage $V_O$.

In operation, the boosted low pass transconductance-capacitor filter 98 illustrated in FIG. 2 provides an output voltage $V_O$ which is the result of filtering the input voltage $V_{IN}$. The transfer function which describes the output of the first stage 100 at NODE 2 with respect to $V_{IN}$ is as follows:

$$H(s) = \frac{1}{s^2/w_0^2 + s/(w_0 Q_0) + 1}$$

where $w_0$ is the pole frequency, and $Q_0$ is the pole Q.

The transfer function which describes the output of the second stage 102 with respect to $V_{IN}$ is as follows:

$$H_0(s) = \frac{As^2/w_1^2 - 1}{(s^2/w_1^2 + s/(w_1 Q_1) + 1)(s^2/w_2^2 + s/(w_2 Q_2) + 1)}$$

where $w_1$ and $w_2$ are pole frequencies, and $Q_1$ and $Q_2$ are the pole Q's for the first and second stage, respectively.

The above transfer function is the overall transfer function for the boosted low pass filter 98. The boost is produced by sensing the current $I_x$ through the capacitor 110. The AC current source 116 utilizes a current sensor circuit constructed according to the teachings of the present invention to supply a current which is proportional to $I_x$.

A technical advantage of the present invention is the capability of producing a boosted low pass transconductance-capacitor filter which solves the bottom plate parasitic capacitance problem associated with other boosted low pass transconductance-capacitor filters. In a conventional transconductance capacitance filter, the existence of a parasitic capacitor whose bottom plate cannot be made available reduces the effectiveness of the boosted low pass scheme. The parasitic capacitance can be as much as thirty percent of the total capacitor value. Sensing the current through the capacitor in the capacitor 110 of the first stage 100 allows a boosted transfer function to be implemented as a weighted sum of the capacitor current $I_x$ and the output voltage. Further, by using transconductance amplifier 120, the boosted low pass filter 98 solves the problem of combining a voltage and a current without the need for an extra transconductance amplifier stage if the filter requires greater than a second order filter.

Although the present invention has been described in detail, it should be understood that various changes, substitutions and alterations can be made hereto without departing from the spirit and scope of the invention as defined by the appended claims.

What is claimed is:

1. A transconductance-capacitor filter system, comprising:
  a voltage to current conversion stage comprising;
    a first transconductance amplifier having a first pair of inputs, a first current path coupled to a first node, and a second current path coupled to a second node, the first transconductance amplifier operable to provide a first level of AC current to the first node and operable to pull the first level of AC current from the second node responsive to a first voltage across the first pair of inputs; and
    a second transconductance amplifier having a second pair of inputs, a third current path coupled to the first node, and a fourth current path coupled to the second node, the second transconductance amplifier operable to provide a second level of AC current to the first node and operable to pull the second level of AC current from the second node responsive to a second voltage across the second pair of inputs;
  an integrator stage having a pair of outputs, a fifth current path coupled to the first node, and a sixth current path coupled to the second node, the integrator stage operable to conduct a sum of the first level of AC current and the second level of AC current from the first node to the second node and operable to provide an output voltage across the pair of outputs responsive to the sum of the first level of AC current and the second level of AC current; and
  a current sensor circuit having a first input coupled to the first node, and a second input coupled to the second node, the current sensor circuit operable to sense the sum of the first level of AC current and the second level of AC current.

2. The transconductance-capacitor filter system of claim 1, wherein the transconductance capacitor filter system further comprises a current summing stage comprising the first node and the second node, the current summing stage operable to produce a sum of the first level of AC current and the second level of AC current at the first node and the second node.

3. The transconductance-capacitor filter system of claim 1, wherein the first transconductance amplifier comprises:
  a first transistor having a first input, a first current node and a second current node, the first current node coupled to the first node;
  a resistor coupled the second current node;
  a second transistor having a second input, a third current node and a fourth current node, the third current node coupled to the second node, and the fourth current node coupled to the resistor;
  a first current source having a first anode and a first cathode, the first anode coupled to the second current node of the first transistor; and
  a second current source having a second anode and a second cathode, the second anode coupled to the fourth current node of the second transistor.

4. The transconductance-capacitor filter system of claim 1, wherein the second transconductance amplifier comprises:
  a first transistor having a first input, a first current node and a second current node, the first current node coupled to the first node;
  a resistor coupled the second current node;
  a second transistor having a second input, a third current node and a fourth current node, the third current node coupled to the second node, and the fourth current node coupled to the resistor;
  a first current source having a first anode and a first cathode, the first anode coupled to the second current node of the first transistor; and
  a second current source having a second anode and a second cathode, the second anode coupled to the fourth current node of the second transistor.

5. The transconductance-capacitor filter system of claim 1, wherein the integrator stage comprises:
  a first transistor having a first output, a first current node and a second current node, the second current node coupled to the first node;
  a capacitor coupled the first current node;
  a second transistor having a second output, a third current node and a fourth current node, the third current node coupled to the capacitor, and the fourth current node coupled to the second node;
  a first current source having a first anode and a first cathode, the first cathode coupled to the first current node of the first transistor; and
  a second current source having a second anode and a second cathode, the second cathode coupled to the third current node of the second transistor.

6. The transconductance-capacitor filter system of claim 1, wherein the current sensor circuit comprises:
  a differential pair having a first input, a second input, a first current node and a second current node, wherein the differential pair is operable to provide a level of AC current at the first current node and to pull the level of AC current from the second current node responsive to a voltage across the first input and the second input;
  a load coupled to the first current node and to the second current node, the load operable to conduct the level of AC current from the first current node to the second current node and operable to sense the level of AC current.

7. The transconductance-capacitor filter system of claim 1, wherein the current sensor circuit comprises:
  a transconductance amplifier comprising;
    a first transistor having a first input, a first current node and a second current node, the second current node coupled to a first node;
    a second transistor having a second input, a third current node and a fourth current node, the fourth current node coupled to the first node;
    a first current source having a first anode and a first cathode, the first cathode coupled to the first current node of the first transistor;
    a second current source having a second anode and a second cathode, the second cathode coupled to the third current node of the second transistor; and
    a third current source having a third anode and a third cathode, the third anode coupled to the first node; and
  a load coupled to the first current node and to the third current node, the load operable to conduct a level of current from the first current node to the third current node and operable to sense the level of current.

8. The transconductance-capacitor filter system of claim 1, wherein the current sensor circuit comprises:
  a transconductance amplifier comprising;
    a first NPN transistor having a first base, a first collector and a first emitter, the first emitter coupled to a first node;
    a second NPN transistor having a second base, a second collector and a second emitter, the second emitter coupled to the first node;

a first current source having a first anode and a first cathode, the first cathode coupled to the first collector of the first NPN transistor;

a second current source having a second anode and a second cathode, the second cathode coupled to the second collector of the second NPN transistor; and a third current source having a third anode and a third cathode, the third anode coupled to the first node; and a load coupled to the first current node and to the third current node, the load operable to conduct a level of current from the first collector to the second collector and operable to sense the level of current.

9. The transconductance-capacitor filter system of claim 1, wherein the current sensor circuit comprises:

a transconductance amplifier comprising;

a first transistor having a first input, a first current node and a second current node, the second current node coupled to a first node;

a second transistor having a second input, a third current node and a fourth current node, the fourth current node coupled to the first node;

a first biasing DC current source having a first anode and a first cathode, the first cathode coupled to the first current node of the second transistor;

a second biasing DC current source having a second anode and a second cathode, the second cathode coupled to the third current node of the first transistor; and a third biasing DC current source having a third anode and a third cathode, the third anode coupled to the first node; and a load coupled to the first current node and to the third current node, the load operable to conduct a level of current from the first collector to the second collector and operable to sense the level of current.

* * * * *